United States Patent [19]

Ohi et al.

[11] Patent Number: 4,963,957

[45] Date of Patent: Oct. 16, 1990

[54] SEMICONDUCTOR DEVICE HAVING BIPOLAR TRANSISTOR WITH TRENCH

[75] Inventors: Susumu Ohi; Masahiko Nakamae; Hiroshi Shiba, all of Tokyo, Japan

[73] Assignee: NEC Corporation, Tokyo, Japan

[21] Appl. No.: 250,670

[22] Filed: Sep. 29, 1988

[30] Foreign Application Priority Data

Sep. 29, 1987 [JP] Japan .................. 62-247175

[51] Int. Cl.[5] .............. H01L 29/72; H01L 27/12; H01L 29/04; H01L 23/48
[52] U.S. Cl. ........................ 357/34; 357/49; 357/59; 357/65
[58] Field of Search ............. 357/34, 49, 596, 65

[56] References Cited

U.S. PATENT DOCUMENTS

| | | | |
|---|---|---|---|
| 4,764,801 | 8/1988 | McLaughlin et al. | 357/34 |
| 4,887,144 | 12/1989 | Cook et al. | 357/34 |
| 4,910,572 | 3/1990 | Kameyama | 357/34 |
| 4,910,575 | 3/1990 | Komeda et al. | 357/34 |

OTHER PUBLICATIONS

T. Sakai et al., "Super Self-Aligned Bipolar Technology", in 1983 Symposium on VLSI Technology, Sep. 13-15, Digest of Technical Papers, pp. 16-19.

K. Ueno et al., "A Sub-40 PS ECL Circuit at a Switching Current of 1.28 MA", in IEDM 1987, Technical Digest, pp. 371-374.

Primary Examiner—Rolf Hille
Assistant Examiner—Robert P. Limanek
Attorney, Agent, or Firm—Sughrue, Mion, Zinn, Macpeak & Seas

[57] ABSTRACT

A semiconductor device having a bipolar transistor with a trench is disclosed. An active region of the substrate is surrounded by the trench. Collector, base and emitter regions of the transistor are formed in the active region. A collector electrode is formed in a lower section of the trench, and a base electrode is formed in an upper section of the identical trench.

6 Claims, 6 Drawing Sheets

SEMICONDUCTOR DEVICE HAVING BIPOLAR TRANSISTOR WITH TRENCH

BACKGROUND OF THE INVENTION

The present invention relates to a semiconductor device having a bipolar transistor with a trench.

Various types of bipolar transistors have, heretofore, been made to reduce the transistor forming region and to enhance an integrated circuit density. For example, the so-called SST type transistor was proposed by T. Sakai et al. entitled "SUPER SELF-ALIGNED BIPOLAR TECHNOLOGY" in 1983 Symposium on VLSI Technology, September 13–15, Digest of Technical papers, pp 16–19, in which the emitter region and the collector region are self-alignedly formed. On the other hand, in a bipolar transistor proposed by K. Ueno et al. entitled "A SUB-40 PS ECL CIRCUIT AT A SWITCHING CURRENT OF 1.28 MA" in IEDM 1987, Technical Digest, pp 371–374, a trench is only employed as an isolation region. In both prior art transistors, however, the $N^+$-type buried layer contacted to the bottom of the $N^-$-type collector region is contacted to another $N^+$-type region at one side and led-out at a portion separated from a portion in which the base electrode of polycrystalline silicon is provided. Therefore, the bipolar transistors in the prior art cannot be further reduced the area of the transistor forming region and the collector resistance cannot be sufficiently decreased.

SUMMARY OF THE INVENTION

Accordingly, an object of the present invention is to provide a semiconductor device in which a bipolar transistor can be formed in a small area of the substrate thereby elevating the integration of the semiconductor device, and the collector resistance can be sufficiently reduced.

According to one feature of the present invention, there is provided a semiconductor device which comprises a semiconductor substrate having a major surface, an element forming region and an isolation region surrounding the element forming region, an active region positioned in the element forming region, a trench formed in the element forming region between the active region and the isolation region and surrounding the active region, the trench having a bottom, a first side wall extending from the major surface to the bottom and abutted to the active region and a second side wall facing to the first side wall and abutted to the isolation region, a collector region of a transistor formed in the active region at an inward portion thereof separated from the major surface of the active region, an emitter region of the transistor formed in the major surface of the active region, a base region of the transistor formed in the active region, a collector electrode formed within a lower section of the trench, and a base electrode formed within an upper section of the trench. The semiconductor device may further comprises an impurity region having the same conductivity type as the collector region and an impurity concentration higher than the collector region, the impurity region being formed in the active region, contacted to the bottom of the collector region and constituting an inward part of the first side wall of the trench in full circle, and a graft base region having the same conductivity type as the base region and an impurity concentration higher than the base region, the graft base region being electrically connected to the base region, formed at a periphery portion of the major surface of the active region and constituting an upper part of the first side wall of the trench in full circle. The collector electrode may be contacted to the impurity region at a first contact portion which encircles a section of the impurity region in the active region and be positioned in the inward part of the first side wall of the trench constituted by the impurity region, and the base electrode may be contacted to the graft base region at a second contact portion which encircles a section of the graft base region in the active region and be positioned in the upper part of the first side wall of the trench constituted by the graft base region. Favorably, the first and second side walls of the trench may extend from the major surface of the substrate to the bottom in substantially perpendicular to the major surface of the substrate, respectively.

According to another feature of the present invention, there is provided a semiconductor device which comprises a semiconductor substrate including a semiconductor body of a first conductivity type, a first impurity layer of a second conductivity type opposite to the first conductivity type formed on the semiconductor body and a second impurity layer of the second conductivity type formed on the first impurity layer, the first impurity layer having an impurity concentration higher than an impurity concentration of the second impurity layer and the second impurity region having a major surface of the semiconductor substrate; a trench formed in the semiconductor substrate from the major surface into the semiconductor body through the first and second impurity layers and surrounding an active region of the semiconductor substrate, the trench having a first side wall, a second side wall facing to the first side wall, and a bottom; a base region of the first conductivity type formed in the second impurity layer of the active region of the semiconductor substrate from the major surface to a predetermined depth of the second impurity layer such that a remaining section of the second impurity layer between the base region and the first impurity layer serves as a collector region of the second conductivity type; an emitter region of the second conductivity type formed in the base region at a center part of the major surface of the active region; a graft base region of the first conductivity type having an impurity concentration higher than an impurity concentration of the base region, separated from the emitter region and surrounding the emitter region, the graft base region being formed at a periphery part of the major surface of the active region; a first insulating film formed on the first and second side walls and on the bottom of the trench except on an upper portion of the first side wall and an inward portion of the first side wall, the upper portion of the inner side wall free from the first insulating film being constituted by the graft base region and surrounding an upper section of the active region, and the inward portion of the first side wall free from the first insulating film being constituted by the first impurity layer and surrounding a section of the first impurity layer; a first polycrystalline silicon layer doped with impurities of the second conductivity type and formed on the first insulating film within the trench, the first polycrystalline silicon layer filling a lower section of the trench and contacted to the first impurity layer at the inward portion of the first side wall of the trench; a second insulating film formed on the first polycrystalline silicon layer within the trench;

a second polycrystalline silicon layer doped with impurities of the first conductivity type, formed on the first and second insulating films within the trench and contacted to the graft base region at the upper portion of the first side wall of the trench; and a means for leading-out the first polycrystalline silicon layer. The leading-out means may include a contact hole formed in the second polycrystalline silicon layer and in the second insulating film to expose a part of the first polycrystalline silicon layer, a third insulating film formed on a side wall of the contact hole of the second polycrystalline silicon layer, a third polycrystalline silicon layer doped with impurities of the second conductivity type and contacted to the part of the first polycrystalline silicon layer through the contact hole, and a metallic electrode formed on the third polycrystalline silicon layer. Further, the active region may be a rectangular or square plane shape delineated by four straight edge lines by the first side wall of the trench. In this case, the trench may include a wider part and narrow parts between the first and second side walls, and the leading-out means may be provided in the wider part of the trench. The first polycrystalline silicon layer for the collector electrode, which can be highly doped with impurities and can has a large cross-section area by deepening the trench, for example, surrounds the collector contact region and be contacted to the collector contact region at side in full circle. Therefore, the collector resistance can be reduced and the collector potential in the collector region becomes uniform in every part thereby good characteristics of the transistor can be obtained. Moreover, the first polycrystalline silicon layer for the collector electrode is positioned just under the second polycrystalline silicon layer for the base electrode in the trench, and therefore, the integration of the device can be sufficiently enhanced.

EXPLANATION OF PRIOR ARTS

Figure 1:
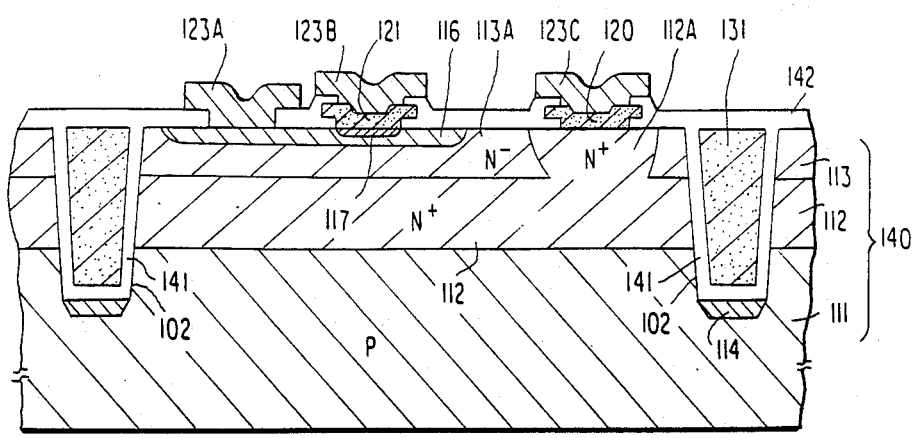
FIGS. 1 and 2 are cross-sectional views showing prior art bipolar transistors, respectively.

Referring to FIG. 1, a transistor forming region of a semiconductor substrate 140 including a P-type silicon body 111, an N+-type buried layer 112 and an N−-type epitaxial layer 113 is surrounded by an isolation region including a trench 102, a P+-type impurity region 114, a silicon oxide film 141 entirely formed on the side wall and bottom of the trench and a polycrystalline silicon layer 131. From the major surface to the N+-type buried layer 112, an N+-type impurity region 112A is formed as a collector lead-out region, and on the region 112A, an N-type polycrystalline silicon layer 120 and a metallic collector electrode 123C are provided in sequence. An N−-type collector region 113A by the N−-type epitaxial layer 113 is provided along the major surface and in the collector region 113A, a P-type base region 116 is formed. A metallic base electrode 123A is connected to a part of the base region through a contact hole formed in a silicon oxide film 142 on the major surface of the substrate. An N+-type emitter region 117 is formed in the P-type base region 116, and an N-type polycrystalline silicon layer 121 and a metallic emitter electrode 123B are formed in sequence on the emitter region 117.

Figure 2:
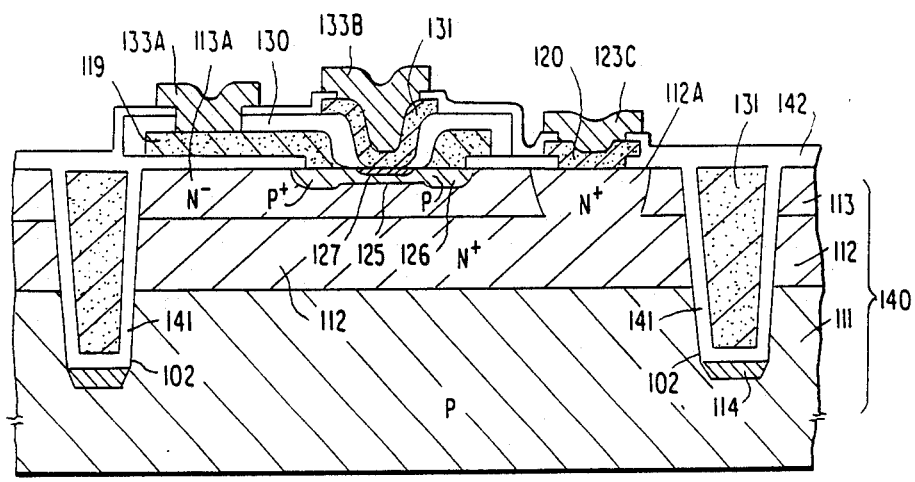

Referring to FIG. 2, an improved bipolar transistor in a prior art will be explained. In FIG. 2, the same components as those in FIG. 1 are indicated by the same reference numerals. A P-type polycrystalline silicon layer 119 is contacted to a part of the substrate where a P+-type graft base region 126 of a ring plan shape is formed. A silicon oxide film 130 is formed on the silicon layer 119 by thermal oxidation of the surface of the silicon layer, and an N-type polycrystalline silicon layer 131 is formed on the silicon oxide film 130 and contacted to a part of a base region 125 surrounded by the P+-type graft base region 126, and at the part of the base region 125 where the N-type silicon layer 131 is connected, an N+-type emitter region 127 is formed. A metallic base electrode 133A and a metallic emitter electrode 133B are connected to the P-type silicon layer 119 and the N-type silicon layer 131, respectively.

DETAILED DESCRIPTION OF EMBODIMENTS

First Embodiment

Figure 3A:
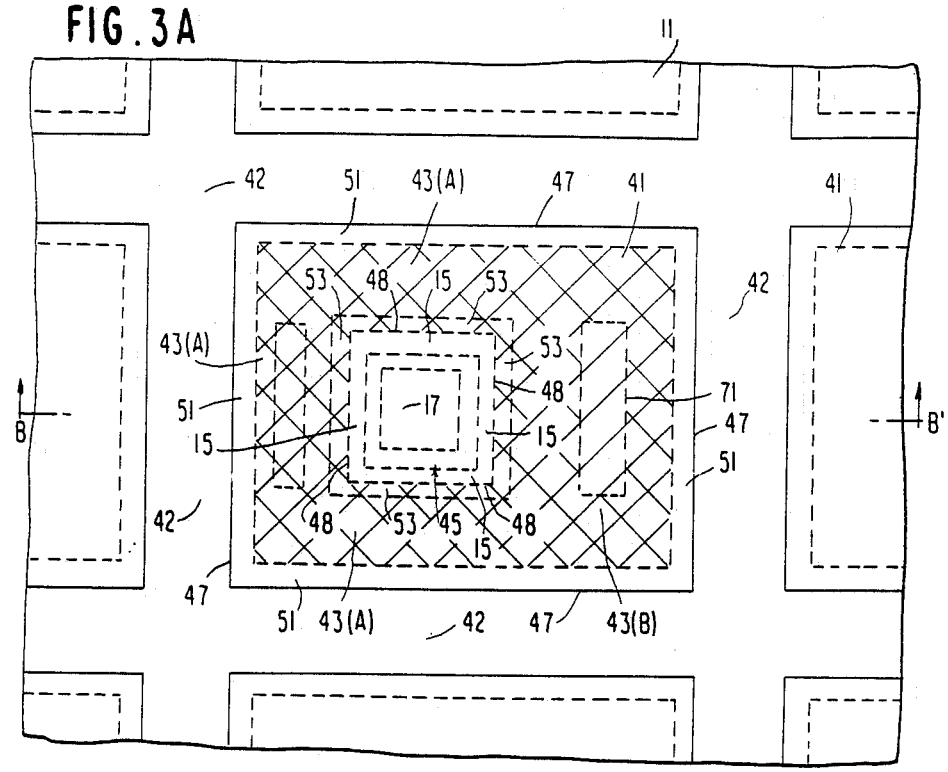
FIG. 3A is a plan view showing a first embodiment of the present invention.
Figure 3B:
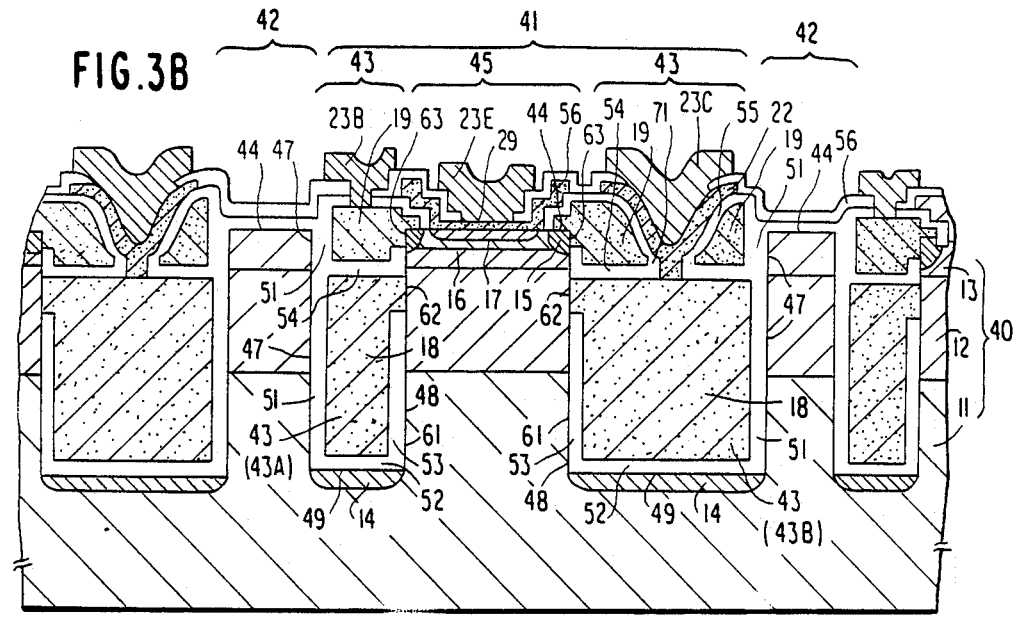
FIG. 3B is a cross-sectional view taken along line B—B' in FIG. 3A as viewed in the direction of arrows.

Referring to FIGS. 3A and 3B, a first embodiment of the present invention will be explained. A semiconductor substrate 40 includes a P-type silicon body 11, an N+-type buried layer 12 having 1.5 μm thickness and formed on the silicon body 11 and an N−-type epitaxial layer 13 having 1.0 μm thickness and a lower impurity concentration than that of the buried layer 12 and formed on the layer 12. These silicon body 11 and layers 12 and 13 are of monocrystalline silicon. A plurality of element forming regions 41 of the substrate are separated each other by an isolation region 42 of 1.0 μm width and having a grid-like shape in the plan view, and a bipolar transistor of the present invention is provided in each of the element forming regions. Hereinafter described on only one bipolar transistor. A trench 43 is formed in the element region 41 from a major surface 44 of the substrate 40, that is, the surface of the N−-type epitaxial silicon layer 13 into the silicon body 11 through both layers 12, 13 by a depth of 5 μm from the major surface 44. The trench 43 surrounds in the plan view a rectangular or a square active region 45 in which base and emitter regions are to be formed, and includes one wide straight portion 43B having 2.5 μm width ($W_B$ in FIG. 5) and three narrow straight portions 43A each having 1.5 μm width ($W_A$ in FIG. 5) so that the four portions 43A, 43B constitute the ring shape trench 43. The second periphery side wall 47 of the trench is abutted against the isolation region 42 in full circle, and the first periphery side wall 48 of the trench is abutted against the active region 45 in full circle. A P+-type region 14 having an impurity concentration higher than that of the silicon body 11 is formed in a bottom 49 of the trench such that the entire bottom of the trench is constituted by the P+-type region 14. A first silicon oxide film 51 is formed on the entire second side wall 47 of the trench from the major surface 44 of the substrate to the bottom of the trench, and a second silicon oxide film 52 is formed on the entire bottom 49 of the trench. A third silicon oxide film 53 is formed on an lower part 61 of the first side wall 48 of the trench in full circle. A first polycrystalline silicon layer 18 doped by N-type impurities is formed on the second and third silicon oxide films 52, 53, on a lower portion of the first silicon oxide film 51 provided on a lower part of the second side wall 47 and on an exposed part 62 of the first side wall 48 to fill a lower section of the trench 43 with the first silicon layer 18 and to contact the first silicon layer 18 to the N+-type silicon buried layer 12 of the active region 45 through the exposed part 62 of the first side wall 48. The exposed part 62 is constituted by the N+-type layer 12 and has 0.8 μm width in the depthwise direction and encircles the inward section of the N+-type layer 12 of the active region 45 in full circle so that the connection between the first polycrystalline silicon layer 18 and the N+-type layer 12 is conducted at all sides of the inward section of the N+-type layer 12. A fourth silicon oxide film 54 is formed on the N-type first polycrystalline silicon layer 18, and a second polycrystalline silicon layer 19 doped by P-type impurities is formed on the fourth silicon oxide film 54, on an upper portion of the first silicon oxide film 51 provided on the upper part of the second side wall 47 and on an exposed upper part 63 of the first side wall 48 to fill an upper section of the trench 43 with the P-type second polycrystalline silicon layer 19. The exposed upper part 63 has 0.2 μm width in the depthwise direction and encircles the upper section of the layer 13 of the active region. Further, the P-type second polycrystalline silicon layer 19 is protruded somewhat to a level higher than the major surface 44 of the substrate and contacted to a peripheral portion of the major surface of the active region 45 in full circle. A P-type impurity region serving as a P-type base region 16 is formed in the major surface of the active region, and a P+-type impurity region of ring plan shape surrounding the active base region 16, having a impurity concentration higher than that of the P-type base region and serving as a P+-type graft base region 15 is formed in the peripheral portion of the active region 45 to contact to the second polycrystalline silicon layer 19 at the major surface of the peripheral portion of the active region 45 and at the upper part 63 of the first side wall 48 of the trench 43 in full circle. In this instance, the remaining N−-type region 20 under the P-type active base region 16 serves as a N−-type active collector region 20, and the N+-type silicon layer 12 in the active region contacted to the bottom of the base region 20 serves as an N+-type buried layer for the collector region 20. The first and second polycrystalline silicon layers 18 and 19 are employed as collector and base electrodes, respectively. A first contact hole 71 having a rectangular plan shape is provided in the second polycrystalline silicon layer 19 and in the fourth silicon oxide film 54 to expose a part of the first polycrystalline silicon layer 18, and a fifth silicon oxide film 55 is formed on the exposed second polycrystalline silicon layer 19. A third polycrystalline silicon layer 22 doped by N-type impurities is formed in the first contact hole 71 to contact to the part of the first polycrystalline silicon layer 18, and a fourth polycrystalline silicon layer 29 doped by N-type impurities is positioned on the N-type emitter region 17. A sixth silicon oxide film 56 is formed entirely by CVD process, and second, third and fourth contact holes are provided in the sixth silicon oxide film and in the sixth and fifth silicon oxide films, respectively. A collector electrode wiring 23C of aluminum contacted to the third polycrystalline silicon layer 22 through the second contact hole, an emitter electrode wiring 23E of aluminum contacted to the fourth polycrystalline silicon layer 29 through the third contact hole and a base electrode wiring 23B of aluminum contacted to the second polycrystalline silicon layer 19 through the fourth contact hole are formed. In FIG. 3A, the first polycrystalline silicon layer 18 for the collector electrode is represented by right-upward hatching, and the second polycrystalline silicon layer 19 for the base electrode is represented by left-upward hatching. Both electrodes 18, 19 are substantially overlapped each other except the rectangular contact portion 71. To avoid complexity, the metallic electrodes 23C, 23E, 23B, the third and fourth polycrystalline silicon layers 22, 29 and silicon oxide films are omitted to show in FIG. 3A. It is to be noted, the impurity regions of the transistor is completely surrounded by the trench and the first silicon oxide film, and moreover at the bottom of the trench the P+-type region is provided, and therefore, even if an inversion layer is produced at the major surface of the isolation region, any unfavorable interference between elements never be occurred.

Referring to FIGS. 4A to 4I and 5, a process for manufacturing the first embodiment will be explained.

Figure 5:
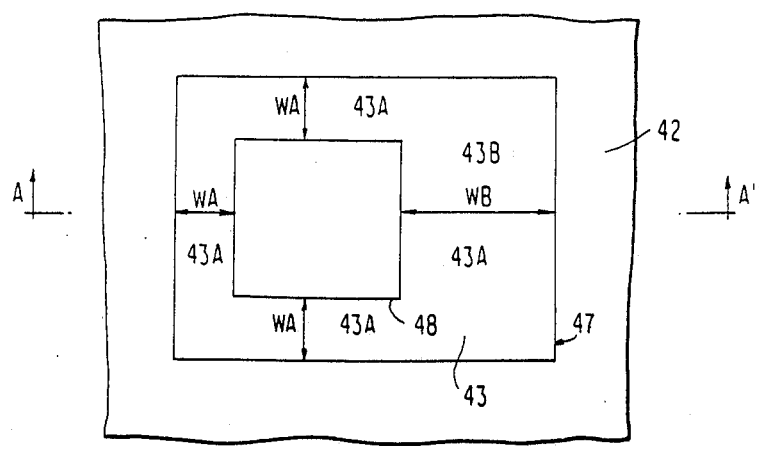
FIG. 5 is a plan view of FIG. 4A.
Figure 4A:
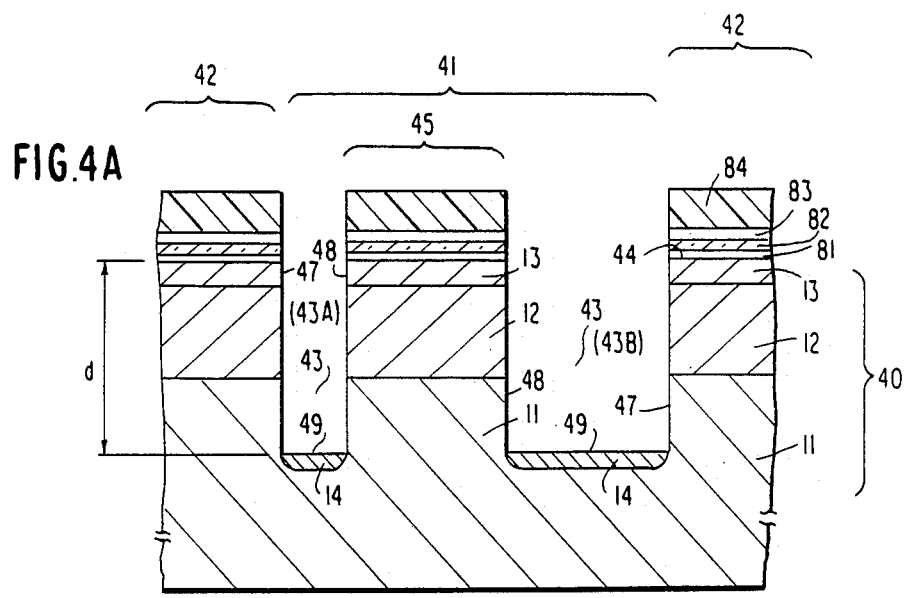
FIGS. 4A to 4I are cross-sectional views showing a manufacturing process steps in sequence for forming the bipolar transistor of the first embodiment.

First, as shown in FIGS. 4A and 5, the N+-type silicon layer as the N+-type buried layer 12 is formed on the P-type silicon body 11 and then the N−-type epitaxial layer 13 is formed. After a silicon oxide film 81 has been formed on the major surface 44 of the N-type epitaxial layer 13 by thermal oxidation, a silicon nitride film 82 is formed, and a silicon oxide film 83 is formed successively by CVD process. Thereafter, the silicon oxide film 83, the silicon nitride film 82, the silicon oxide film 81, the N−-type epitaxial layer 13, the N+-type buried layer 12 and the P-type silicon body 11 are etched by using a photoresist 84 as a mask to form the trench 43 extending inwardly in perpendicular to the major surface 44. The trench 43 includes the portion 43B having the wide width $W_B$ of 2.5 μm and the portions 43A having the narrow width $W_A$ of 1.5 μm, and each portion has the depth d of 5.0 μm. The ring shaped trench 43 surrounds completely the active region 45, and outside the trench 43, the isolation region 42 of the substrate is positioned and surrounds the trench. Further, the P+-type region 14 is formed in the bottom 49 of the trench 43. It should be noted that the wide portion 43B of the trench 43 that is relatively wide is a region through which an Al electrode of the collector is led out.

Figure 4B:
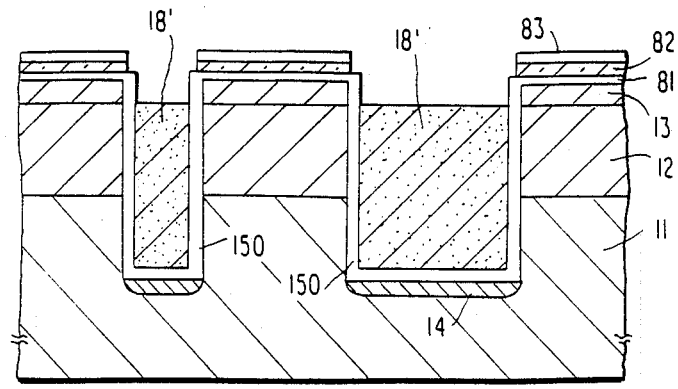

Next, as shown in FIG. 4B, the photoresist 84 is removed and then a silicon oxide film 150 is formed on the first and second side walls and on the bottom of the trench by thermal oxidation. Thereafter, a polycrystalline silicon layer 18' is buried in the trench such that the upper surface of the polycrystalline silicon is below the upper surface of the N+-type buried layer 12, and diffusion of N-type impurities are then carried out.

Figure 4C:
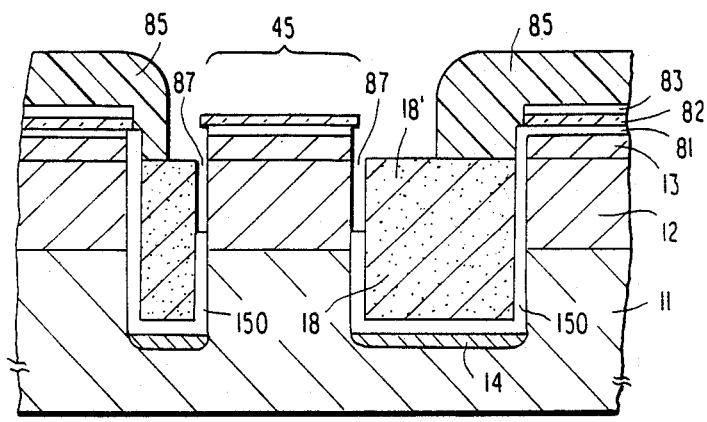

Next, as shown in FIG. 4C, the silicon oxide film 150 on the first side wall of the trench at the side thereof which is closer to the active region 45 is etched by using a photoresist 85 as a mask to form a groove 87 which is shallower than the boundary between the N+-type buried layer 12 and the P-type silicon body 11.

Figure 4D:
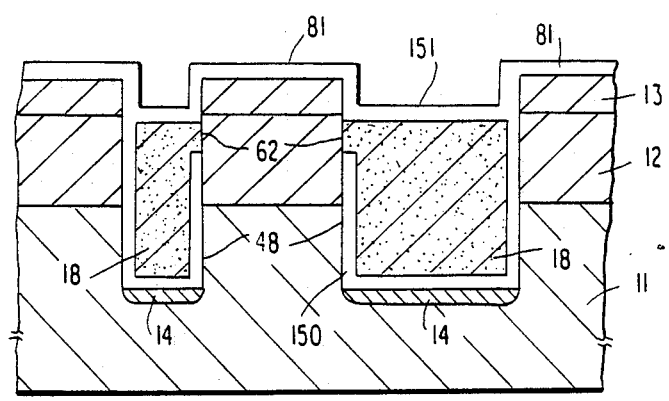

Next, as shown in FIG. 4D, after removing the photoresist film 85, the shallow groove 87 is filled with a new polycrystalline silicon, and the surface of the combined N-type polycrystalline silicon layer 18 is oxidized to form a silicon oxide film 151. Thereafter, the silicon oxide film 83 formed by CVD process and the silicon nitride film 82 are removed. In this state, the N-type polycrystalline silicon layer 18 within the trench is in electrical contact with the N+-type buried layer 12 at the part 62 of the first side wall 45 of the trench in full circle.

Figure 4E:
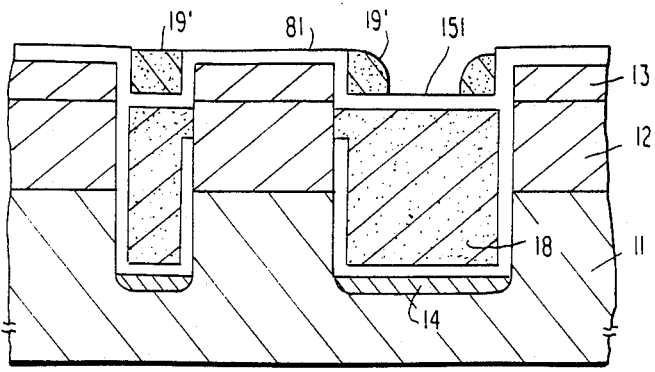

Next, as shown in FIG. 4E, a polycrystalline silicon 19 which contains P-type impurities are formed again in the upper part of the trench on the silicon oxide film 151. At this time, the deposition and etching of the polycrystalline silicon 19' are carried out so that the narrow portion 43A of the trench that is relatively narrow is completely filled but the relatively wide portion 43B of the trench has the polycrystalline silicon 19' left only on the inner wall.

Figure 4F:
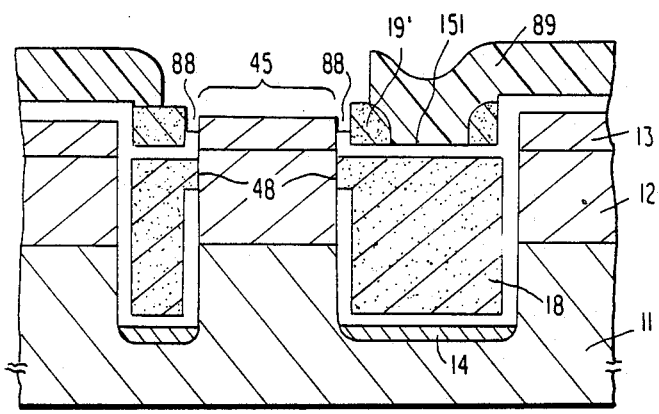

Next, as shown in FIG. 4F, the silicon oxide film 81 on the surface of the active region 45 and the silicon oxide film on the first side wall 48 of the upper portion of the trench at the side thereof which is closer to the active region is etched by using a photoresist 89 as a mask to form a groove 88 along the first side wall 48, the groove 88 being shallower than the N−-type silicon epitaxial layer 13.

Figure 4G:
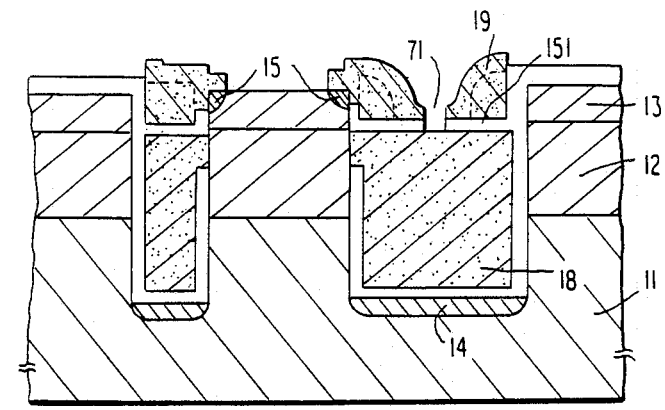

Next, as shown in FIG. 4G, after removing the photoresist 89 a non-doped polycrystalline silicon is newly grown and P-type impurities contained in the P+-type polycrystalline silicon 19' buried in the trench are diffused into the non-doped polycrystalline silicon. Then, only the non-doped polycrystalline silicon parts are selectively removed with a solution such as KOH, $N_2H_4$ or the like, thereby filling the shallow groove 88 to form the P-type polycrystalline silicon layer 19, thus forming P+-type graft base region 15 by introducing P-type impurities through the second silicon layer 19 within the N−-type epitaxial layer 13 which is in contact with the combined P+-type polycrystalline silicon layer 19. Next, the P+-type polycrystalline silicon layer 19 and the silicon oxide film 151 above the wide portion 43B of the trench are etched to form an opening 71.

Figure 4H:
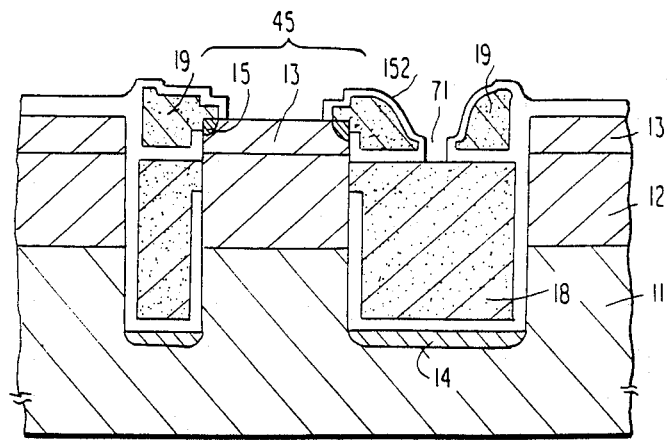

Next, as shown in FIG. 4H, the respective surfaces of the P+-type polycrystalline silicon layer 19 and the N-type epitaxial layer 13 are oxidized. At this time, since the polycrystalline silicon layer 19 that contain a P-type impurities have a relatively high rate of oxidation, a relatively thick oxide film is formed on their surfaces. Therefore, an appropriate oxide film etching process is carried out so that the oxide film is left only on the polycrystalline silicon layer 19, while the oxide film on the N-type epitaxial layer 13 in the element region 45 and that in the opening 71 above the N-type polycrystalline silicon layer 18 are removed.

Figure 4I:
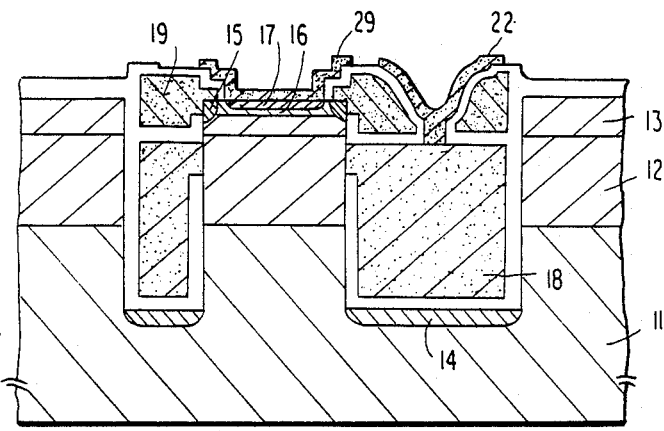

Next, as shown in FIG. 4I, a P-type active base region 16 is formed on the N−-type epitaxial layer 13 by ion implantation at the active region 45, and an N+-type polycrystalline silicon layers 22 and 29 are simultaneously then formed. N-type impuries contained in the N+-type polycrystalline silicon layer 29 are diffused into the P-type base region 16 to form an N-type emitter region 17.

Thereafter, a silicon oxide film 56 is formed on the surface by CVD process. Then, necessary contact holes are provided in the silicon oxide film above the P+-type polycrystalline silicon layer 19 and above the N+-type polycrystalline silicon layer 22, 29 respectively, and Al electrodes 23B, 23C and 23E are formed to complete a semiconductor device according to the first embodiment of the present invention shown in FIG. 3. The silicon oxide films 150 to 152 in the process steps correspond to the first to fifth silicon oxide films 51 to 55 in FIG. 3 at the respective positions.

Second Embodiment

Figure 6:
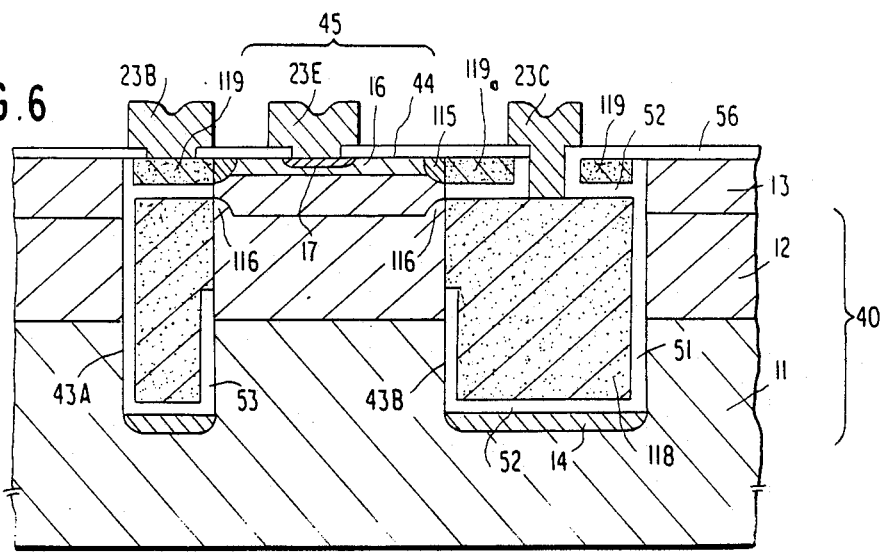
FIG. 6 is a cross-sectional view showing a second embodiment of the present invention.

Referring to FIG. 6, a second embodiment of the present invention will be explained. In FIG. 6, the same components as those in FIG. 3 are indicated by the same reference numerals. In the second embodiment, a first polycrystalline silicon layer 118 of N-type and a second polycrystalline silicon layer 119 of P-type correspond to the first and second polycrystalline silicon layers 18 and 19 in FIG. 3 (first embodiment), respectively, and a P+-type graft base region 115 corresponds to the P+-type graft base region 15 in FIG. 3. The region of the N+-type polycrystalline silicon 118 buried in the trench 43 including portions 43A and 43B which is in contact with the collector region is extended upwardly at a level higher than the boundary between the N−-type epitaxial layer 13 and the N+-type buried layer 12, and a small and ring plan shaped N+-region 115 is formed by introducing N-type impurities through the protruded portion of the first silicon layer 118 into the N−-type epitaxial layer 12 at the active region 45. That is, the boundary between the N+-type layer 12 and the N−-type layer 13 of active collector region involves the ring shaped small protrusion. The structure can be expected further reduced collector series resistance. In addition, the N-type emitter region 17 is formed apart from the trench 43 (43A, 43B) using a photoresist as a mask. When a higher voltage transistor is required, the structure is favorable, because the breakdown voltage between the emitter and the base is raised and the mask alignment is facilitated. Moreover, in the second embodiment, the upper surface of the second polycrystalline silicon layer 119 is substantially co-planar with the major surface of the epitaxial layer 13. Therefore, a higher realiable formation of the metal electrodes are realized.

What is claimed is:

1. A semiconductor device comprising a semiconductor substrate having an element forming region and an isolation region surrounding said element forming region, said semiconductor substrate including a semiconductor body of a first conductivity type having a flat upper face, a first impurity layer of a second conductivity type opposite to said first conductivity type formed on said upper face of said semiconductor body and a second impurity layer of said second conductivity type formed on said first impurity layer, said first impurity layer having an impurity concentration higher than an impurity concentration of said second impurity layer and said second impurity region having a major surface of said semiconductor substrate;

a trench formed in said element forming region of said semiconductor substrate from said major surface into said semiconductor body under said upper face thereof through said first and second impurity layers and surrounding an active region of said element forming region of said semiconductor substrate, said trench having a first side wall abutted to said active region, a second side wall facing to said first side wall and abutted to said isolation region, and a bottom so that said first side wall includes an upper section constituted of said second impurity layer of said active region, a middle section constituted of said first impurity layer of said active region and a lower section constituted of said semiconductor body, that said second side wall includes an upper section constituted of said second impurity layer of said isolation region, a middle section constituted of said first impurity layer of said isolation region and a lower section constituted of said semiconductor body, and that said bottom is constituted of said semiconductor body;

a base region of said first conductivity type formed in said second impurity layer of said active region of said semiconductor substrate from said major surface to a predetermined depth of said second impurity layer such that a remaining section of said second impurity layer between said base region and said first impurity layer serves as a collector region of said second conductivity type;

an emitter region of said second conductivity type formed in said base region at a center part of said major surface of said active region;

a graft base region of said first conductivity type having an impurity concentration higher than an impurity concentration of said base region, separated from said emitter region and surrounding said emitter region, said graft base region being formed at a periphery part of said major surface of said second impurity layer of said active region;

a first insulating film formed on said first and second side walls and on said bottom of said trench, said first insulating film being absent on an upper portion of said upper section of said first side wall so that said graft base region is exposed and that said exposed graft base region surrounds said active region and absent on an upper portion of said middle section of said first side wall so that a part of said first impurity layer of said active region is exposed and that said exposed part of said first impurity layer surrounds said active region;

a first polycrystalline silicon layer doped with impurities of said second conductivity type and formed on said first insulating film within said trench, said first polycrystalline silicon layer filling a lower portion of said trench, facing said middle and lower sections of said second side wall via said first insulating film, facing said bottom via said first insulating film, facing said lower section and a lower portion of said middle section of said first side wall via said first insulating film, and contacted to said exposed part of said first impurity region of said active region at said upper portion of said middle section of said first said wall;

a second insulating film formed on said first polycrystalline silicon layer within said trench;

a second polycrystalline silicon layer doped with impurities of said first conductivity type, formed on said first and second insulating films within said trench and contacted to said graft base region at said upper portion of said upper section of said first side wall of said trench; and a means for leading-out said first polycrystalline silicon layer.

2. A semiconductor device of claim 1, in which said first and second side walls of said trench extend from said major surface of said substrate to said bottom in substantially perpendicular to said major surface of said substrate, respectively.

3. A semiconductor device of claim 1, in which said leading-out means includes a contact hole formed in said second polycrystalline silicon layer and in said second insulating film to expose a part of said first polycrystalline silicon layer, a third insulating film formed on a side wall in said contact hole of said second polycrystalline silicon layer, a third polycrystalline silicon layer doped with impurities of said second conductivity type, and contacted to said part of said first polycrystalline silicon layer through said contact hole, and a metallic electrode formed on said third polycrystalline silicon layer.

4. A semiconductor device of claim 1, in which said active region is a rectangular or square plane shape delineated by four straight edge lines by said first side wall of said trench.

5. A semiconductor device of claim 1, in which said trench includes a wider part and narrow parts between said first and second side walls, and said leading-out means is provided in said wider part of said trench.

6. A semiconductor device of claim 1 further comprising an impurity region of said first conductivity type having an impurity concentration higher than that of said semiconductor body, said impurity region being formed in said bottom of said trench so that entire said bottom is constituted of said impurity region of said semiconductor body.

* * * * *